United States Patent
Hua et al.

(10) Patent No.: US 8,952,542 B2
(45) Date of Patent: Feb. 10, 2015

(54) METHOD FOR DICING A SEMICONDUCTOR WAFER HAVING THROUGH SILICON VIAS AND RESULTANT STRUCTURES

(71) Applicant: Advanced Semiconductor Engineering, Inc., Kaohsiung (TW)

(72) Inventors: Pei Hsing Hua, Taoyuan (TW); Hui-Shan Chang, Jhongli (TW)

(73) Assignee: Advanced Semiconductor Engineering, Inc. (TW)

( * ) Notice: Subject to any disclaimer, the term of this patent is extended or adjusted under 35 U.S.C. 154(b) by 142 days.

(21) Appl. No.: 13/676,888

(22) Filed: Nov. 14, 2012

(65) Prior Publication Data

US 2014/0131876 A1 May 15, 2014

(51) Int. Cl.
| | |
|---|---|
| H01L 23/48 | (2006.01) |
| H01L 23/52 | (2006.01) |
| H01L 21/78 | (2006.01) |
| H01L 23/00 | (2006.01) |
| H01L 21/768 | (2006.01) |

(52) U.S. Cl.
CPC .............. *H01L 21/78* (2013.01); *H01L 23/481* (2013.01); *H01L 23/562* (2013.01); *H01L 21/76898* (2013.01); *H01L 2924/0002* (2013.01); *H01L 2224/13* (2013.01)
USPC ........... 257/774; 257/773; 257/786; 257/750; 257/782; 257/E23.011; 257/E23.145

(58) Field of Classification Search
CPC ................ H01L 23/481; H01L 23/562; H01L 23/49811; H01L 24/05; H01L 24/11; H01L 24/13; H01L 24/73
USPC .......... 257/774, 773, 786, 750, 782, E23.011, 257/E23.145; 438/463, 113
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,191,405 A | 3/1993 | Tomita et al. |
| 5,229,647 A | 7/1993 | Gnadinger |
| 5,239,448 A | 8/1993 | Perkins et al. |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Nitin Parekh
(74) *Attorney, Agent, or Firm* — Morgan Law Offices, PLC

(57) ABSTRACT

The present invention provides a semiconductor device, a semiconductor package and a semiconductor process. The semiconductor process includes the following steps: (a) providing a semiconductor wafer having a first surface, a second surface and a passivation layer; (b) applying a first laser on the passivation layer to remove a part of the passivation layer and expose a part of the semiconductor wafer; (c) applying a second laser, wherein the second laser passes through the exposed semiconductor wafer and focuses at an interior of the semiconductor wafer; and (d) applying a lateral force to the semiconductor wafer. Whereby, the cutting quality is ensured.

20 Claims, 19 Drawing Sheets

(56) References Cited

U.S. PATENT DOCUMENTS

| | | | |
|---|---|---|---|
| 5,308,443 A | 5/1994 | Sugihara | |
| 5,404,044 A | 4/1995 | Booth et al. | |
| 5,615,477 A | 4/1997 | Sweitzer | |
| 5,643,831 A | 7/1997 | Ochiai et al. | |
| 5,998,292 A | 12/1999 | Black et al. | |
| 6,276,599 B1 | 8/2001 | Ogawa | |
| 6,329,631 B1 | 12/2001 | Yueh | |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,577,013 B1 | 6/2003 | Glenn et al. | |
| 6,670,269 B2 | 12/2003 | Mashino | |
| 6,699,787 B2 | 3/2004 | Mashino | |
| 6,740,950 B2 | 5/2004 | Paek | |
| 6,812,549 B2 | 11/2004 | Umetsu et al. | |
| 6,815,348 B2 | 11/2004 | Mashino | |
| 6,916,725 B2 * | 7/2005 | Yamaguchi | 438/459 |
| 6,962,829 B2 | 11/2005 | Glenn et al. | |
| 7,029,937 B2 * | 4/2006 | Miyazawa | 438/40 |
| 7,078,269 B2 | 7/2006 | Yamasaki et al. | |
| 7,134,198 B2 | 11/2006 | Nakatani | |
| 7,157,372 B1 | 1/2007 | Trezza | |
| 7,214,615 B2 * | 5/2007 | Miyazawa | 438/667 |
| 7,215,032 B2 | 5/2007 | Trezza | |
| 7,222,420 B2 | 5/2007 | Moriizumi | |
| 7,238,590 B2 | 7/2007 | Yang et al. | |
| 7,262,475 B2 | 8/2007 | Kwon et al. | |
| 7,276,787 B2 | 10/2007 | Edelstein et al. | |
| 7,285,434 B2 | 10/2007 | Yee et al. | |
| 7,298,030 B2 | 11/2007 | McWilliams et al. | |
| 7,334,326 B1 | 2/2008 | Huemoeller et al. | |
| 7,358,602 B2 * | 4/2008 | Hara | 257/689 |
| 7,365,436 B2 | 4/2008 | Yamano | |
| 7,371,602 B2 | 5/2008 | Yee | |
| 7,388,293 B2 | 6/2008 | Fukase et al. | |
| 7,415,762 B2 | 8/2008 | Fukase et al. | |
| 7,482,272 B2 | 1/2009 | Trezza | |
| 7,508,057 B2 | 3/2009 | Shiraishi et al. | |
| 7,508,079 B2 | 3/2009 | Higashi | |
| 7,528,053 B2 | 5/2009 | Huang et al. | |
| 7,538,033 B2 | 5/2009 | Trezza | |
| 7,553,752 B2 | 6/2009 | Kuan et al. | |
| 7,560,744 B2 | 7/2009 | Hsiao et al. | |
| 7,598,163 B2 | 10/2009 | Callahan et al. | |
| 7,605,463 B2 | 10/2009 | Sunohara | |
| 7,625,818 B2 | 12/2009 | Wang | |
| 7,642,132 B2 | 1/2010 | Huang et al. | |
| 7,656,023 B2 | 2/2010 | Sunohara et al. | |
| 7,659,202 B2 | 2/2010 | Trezza | |
| 7,666,711 B2 | 2/2010 | Pagaila et al. | |
| 7,678,685 B2 | 3/2010 | Sunohara et al. | |
| 7,681,779 B2 | 3/2010 | Yang | |
| 7,687,397 B2 | 3/2010 | Trezza | |
| 7,691,747 B2 | 4/2010 | Lin et al. | |
| 7,733,661 B2 | 6/2010 | Kossives et al. | |
| 7,741,148 B1 | 6/2010 | Marimuthu et al. | |
| 7,741,152 B2 | 6/2010 | Huang et al. | |
| 7,741,156 B2 | 6/2010 | Pagaila et al. | |
| 7,772,081 B2 | 8/2010 | Lin et al. | |
| 7,772,118 B2 | 8/2010 | Yamano | |
| 7,786,008 B2 | 8/2010 | Do et al. | |
| 7,786,592 B2 | 8/2010 | Trezza | |
| 7,795,140 B2 | 9/2010 | Taguchi et al. | |
| 7,808,060 B2 | 10/2010 | Hsiao | |
| 7,808,111 B2 | 10/2010 | Trezza | |
| 7,811,858 B2 | 10/2010 | Wang et al. | |
| 7,816,265 B2 | 10/2010 | Wang | |
| 7,842,597 B2 | 11/2010 | Tsai | |
| 8,399,987 B2 * | 3/2013 | Kwon et al. | 257/730 |
| 2002/0017855 A1 | 2/2002 | Cooper et al. | |
| 2002/0084513 A1 * | 7/2002 | Siniaguine | 257/621 |
| 2002/0094605 A1 | 7/2002 | Pai et al. | |
| 2004/0124518 A1 | 7/2004 | Karnezos | |
| 2004/0259292 A1 | 12/2004 | Beyne et al. | |
| 2005/0189635 A1 | 9/2005 | Humpston et al. | |
| 2005/0258545 A1 | 11/2005 | Kwon | |
| 2006/0027632 A1 | 2/2006 | Akram | |
| 2006/0148250 A1 * | 7/2006 | Kirby | 438/667 |
| 2006/0197216 A1 | 9/2006 | Yee | |
| 2007/0048896 A1 | 3/2007 | Andry et al. | |
| 2007/0138562 A1 | 6/2007 | Trezza | |
| 2007/0187711 A1 | 8/2007 | Hsiao et al. | |
| 2008/0272486 A1 | 11/2008 | Wang et al. | |
| 2009/0032928 A1 | 2/2009 | Chiang et al. | |
| 2009/0039527 A1 | 2/2009 | Chan et al. | |
| 2009/0140436 A1 | 6/2009 | Wang | |
| 2009/0146297 A1 | 6/2009 | Badakere et al. | |
| 2009/0166785 A1 | 7/2009 | Camacho et al. | |
| 2009/0243045 A1 | 10/2009 | Pagaila et al. | |
| 2009/0294959 A1 | 12/2009 | Chiang et al. | |
| 2009/0302435 A1 | 12/2009 | Pagaila et al. | |
| 2009/0302437 A1 | 12/2009 | Kim et al. | |
| 2009/0309235 A1 | 12/2009 | Suthiwongsunthorn et al. | |
| 2009/0321916 A1 | 12/2009 | Wang et al. | |
| 2010/0059855 A1 | 3/2010 | Lin et al. | |
| 2010/0065948 A1 | 3/2010 | Bae et al. | |
| 2010/0133704 A1 | 6/2010 | Marimuthu et al. | |
| 2010/0140737 A1 | 6/2010 | Lin et al. | |
| 2010/0140751 A1 | 6/2010 | Tay et al. | |
| 2010/0140752 A1 | 6/2010 | Marimuthu et al. | |
| 2010/0140776 A1 | 6/2010 | Trezza | |
| 2010/0148316 A1 | 6/2010 | Kim et al. | |
| 2010/0187681 A1 | 7/2010 | Chen et al. | |
| 2010/0197134 A1 | 8/2010 | Trezza | |
| 2010/0230759 A1 | 9/2010 | Yang et al. | |
| 2010/0230760 A1 | 9/2010 | Hung | |
| 2010/0230788 A1 | 9/2010 | Peng | |
| 2010/0244244 A1 | 9/2010 | Yang | |
| 2010/0276690 A1 | 11/2010 | Chen | |
| 2010/0327465 A1 | 12/2010 | Shen et al. | |
| 2011/0048788 A1 | 3/2011 | Wang et al. | |
| 2011/0068437 A1 | 3/2011 | Chiu et al. | |
| 2011/0133333 A1 * | 6/2011 | Kwon et al. | 257/737 |
| 2012/0235305 A1 * | 9/2012 | Kim et al. | 257/774 |

* cited by examiner

METHOD FOR DICING A SEMICONDUCTOR WAFER HAVING THROUGH SILICON VIAS AND RESULTANT STRUCTURES

BACKGROUND OF THE INVENTION

1. Field of the Invention

The present invention relates to semiconductor wafer processing and, more particularly, to a method for dicing a semiconductor wafer using laser technology.

2. Description of the Related Art

In a typical semiconductor manufacturing process, a large number of semiconductor devices are formed on a silicon wafer. The semiconductor devices are made by forming thin layers of semiconductor, insulator, and metal materials patterned to form electronic components and integrated circuits. After the semiconductor devices are formed on the wafer, each of the devices (die) must be separated. The process of separating the individual die is referred to as "dicing" the wafer.

Traditionally, dicing saws have been used for dicing a semiconductor wafer. However, where the thickness of the semiconductor wafer is very thin, the dicing process performed by the cutting blade can result in the collapse of the semiconductor wafer. In addition, the traditional cutting blade is no longer suitable for very narrow cutting lines. Although laser-based techniques have been used to overcome some of the problems with sawing, yield rates are low when singulating wafers having uneven surfaces using conventional laser cutting technology.

SUMMARY OF THE INVENTION

One aspect of the disclosure relates to a semiconductor device. In one embodiment, the semiconductor device includes a die; at least one conductive via formed in the die; a passivation layer disposed on a portion of a back surface of the die, wherein the conductive via protrudes from the passivation layer; and a protection cap disposed on the protruded end of the conductive via; wherein the passivation layer has a lateral surface inclined at an angle greater than 90 degrees with respect to a portion of the back surface of the die not covered by the passivation layer. The portion of the back surface of the die not covered by the passivation layer is situated along a periphery of the back surface of the die and has a first roughness. An upper surface of the passivation layer has a second roughness, the first roughness substantially less than the second roughness. The first roughness is caused by a laser sintering process. Additionally, a lateral surface of the die has a first portion having a third roughness, a second portion having a fourth roughness, and a third portion having a fifth roughness; wherein the third roughness, the fourth roughness, and the fifth roughness are substantially different. The fourth roughness is caused by laser stealth dicing. In an embodiment, the fourth roughness is at least 50 times greater than the first roughness. Additionally, the third roughness and the fifth roughness is each greater than the first roughness.

Another aspect of the disclosure relates to a semiconductor package. In one embodiment, the semiconductor package includes a first substrate; a semiconductor device disposed on the first substrate, comprising: a die; at least one conductive via formed in the die; a passivation layer disposed on a portion of a back surface of the die, wherein the conductive via protrudes from the passivation layer; and a protection cap disposed on the protruded conductive via; wherein the passivation layer has a lateral surface inclined at an obtuse angle with respect to a portion of the back surface of the die not covered by the passivation layer; a second semiconductor device disposed on the semiconductor device and electrically connected to the conductive via; and a molding compound encapsulating the first substrate, the semiconductor device and the second semiconductor device. The passivation layer has a lacuna portion along a periphery of the passivation layer, and a lateral side of the passivation layer assumes an inclination angle of 90 degrees to 115 degrees with respect to the back surface of the die. In an embodiment, the protection cap comprises a seed layer, a Cu layer on the seed layer, a Ni layer on the Cu layer, a Pd layer on the Ni layer and an Au layer on the Pd layer. In another embodiment, the protection cap comprises a seed layer, a Cu layer on the seed layer, a Ni layer on the Cu layer, and a Sn/Ag alloy or Au layer on the Ni layer. The portion of the back surface of the die not covered by the passivation layer is situated along a periphery of the back surface of the die and has a first roughness. An upper surface of the passivation layer has a second roughness, the first roughness substantially less than the second roughness. The first roughness is caused by a laser sintering process. Additionally, a lateral surface of the die has a first portion having a third roughness, a second portion having a fourth roughness, and a third portion having a fifth roughness; wherein the third roughness, the fourth roughness, and the fifth roughness are substantially different. The fourth roughness is caused by laser stealth dicing. Additionally, the third roughness and the fifth roughness is each greater than the first roughness.

Another aspect of the disclosure relates to a method of dicing a semiconductor wafer. In one embodiment, the method includes providing a semiconductor wafer having a first surface, a second surface and a passivation layer, wherein the passivation layer is disposed on the second surface; applying a first laser on the passivation layer to remove a part of the passivation layer and expose a part of the semiconductor wafer; applying a second laser, wherein the second laser passes through the second surface of the semiconductor wafer and focuses at an interior portion of the semiconductor wafer; and applying a lateral force to the semiconductor wafer. The method can further include forming a protection cap on each of the tips. The step of providing the semiconductor wafer comprises: providing the semiconductor wafer having the first surface, the second surface and the at least one conductive via, wherein the conductive via is disposed in the semiconductor wafer; attaching a first carrier to the first surface of the semiconductor wafer; exposing a tip of the at least one conductive via by removing a portion of the semiconductor wafer from the second surface; covering the exposed tips with the passivation layer; and thinning the passivation layer so that the tips protrude from the passivation layer.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
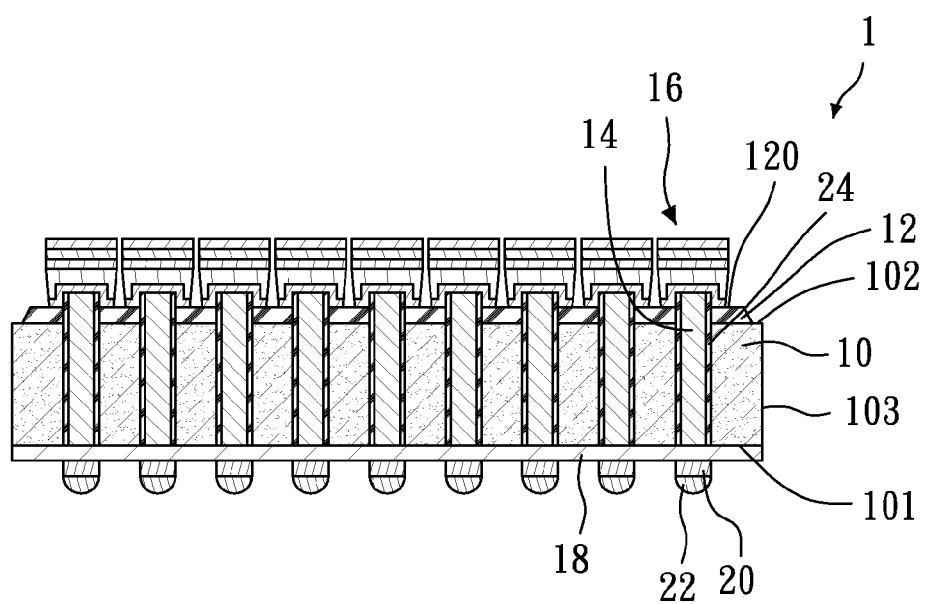
FIG. 1 illustrates a cross-sectional view of a semiconductor device according to an embodiment of the present invention.

Referring to FIG. 1, a cross-sectional view of a semiconductor device 1, according to an embodiment of the present invention, is illustrated. The semiconductor device 1 comprises a substrate 10, an active surface 18 disposed on a first (lower) surface 101 of the substrate 10, an integrated circuit (not shown) formed on the active surface 18, a passivation layer 12 disposed on a second (upper) surface 102 of the substrate 10, the substrate further having third (side) surfaces 103, at least one conductive via 14 formed in the substrate 10, wherein a protection cap 16 is formed over a protruding end of the conductive via 14, at least one die bond pad 20 disposed on the active surface 18 and a connection element 22 disposed on each of the bond pads 20, respectively. The connection element 22 may be a copper pillar, solder or a solder bump, a stud bump or a combination of any of the above.

The substrate 10 can be made from silicon, germanium, gallium arsenide, or other semiconductor material. The integrated circuit is formed by wafer fabrication technology known to those of ordinary skill. The active surface 18 has bond pads 20 which are electrically connect to the integrated circuit. However, it is to be understood that the substrate 10 may be an interposer having no integrated circuit.

The passivation layer 12 is disposed on the second surface 102 of the substrate 10. The passivation layer 12 may be a non-conductive polymer such as polyimide (PI), epoxy, polybenzoxazole (PBO) or benzocyclobutene (BCB); alternatively, an inorganic passivation layer, such as silicon dioxide ($SiO_2$) may be used. In the present embodiment, the passivation layer 12 is a photo sensitive polymer, such as benzocyclobutene (BCB).

The conductive via 14 is disposed in the substrate 10 and surrounded by a non-conductive liner 24. The conductive via 14 is made of a suitable conductive material such as copper, and the material of the liner 24 is an insulation material such as a non-conductive polymer, including polyimide (PI), epoxy, polybenzoxazole (PBO) or benzocyclobutene (BCB), or an inorganic material, such as silicon dioxide ($SiO_2$). The conductive via 14 penetrates the substrate 10 and the passivation layer 12, and an end of the conductive via 14 and the liner 24 protrude from the passivation layer 12. In the present embodiment, the top surface of the protruding end of the conductive via 14 is substantially coplanar with the top surface of the liner 24.

The protection cap 16 is disposed on the protruding ends of the conductive via 14 and the liner 24. In this embodiment, the protection cap 16 covers the top surface of the conductive via 14 and the protruding portion of the liner 24.

Figure 2:
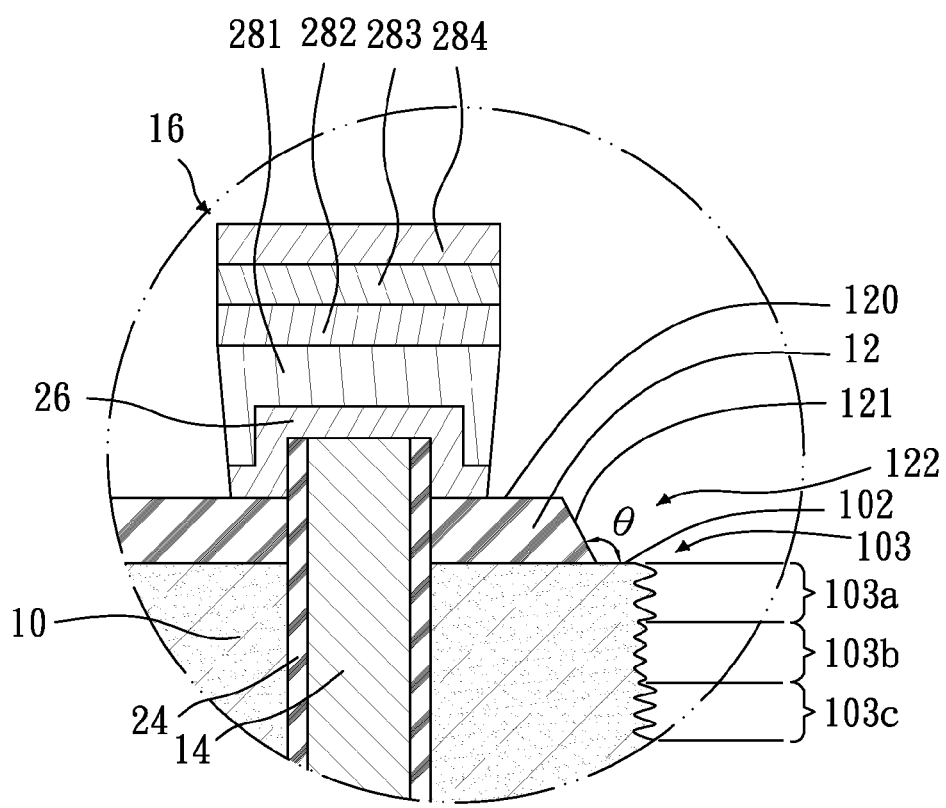
FIG. 2 illustrates a partially enlarged view of FIG. 1.

Referring to FIG. 2, a partially enlarged view of FIG. 1 is illustrated. The protection cap 16 has a seed layer 26, a first conductive layer 281, a second conductive layer 282, a third conductive layer 283, and a fourth conductive layer 284, as shown. At a periphery of the semiconductor device 1, a lateral surface of the passivation layer 12 has a tapered shape having an angle θ which is a result of a two-stage laser dicing process described in detail below.

The passivation layer 12 has a top surface 120, a side surface 121 and a lacuna portion 122. The lacuna portion 122 surrounds the passivation layer 12, so that a part of the second surface 102 of the substrate 10 is exposed. There is a step between the top surface 120 and the second surface 102 of the substrate 10; that is, the side surface 121 of the passivation layer 12 is not coplanar with the side surface 103 of the substrate 10, and the inclination angle θ is formed between the side surface 121 of the passivation layer 12 and the second surface 102 of the substrate 10.

The second surface 102 of the substrate 10 has a first roughness R1 and the top surface 120 of the passivation layer 12 has a second roughness R2. As will be described in greater detail, the roughness R1 is caused by a first stage laser process. The roughness R2 is larger than the first roughness R1.

The side surface 103 of the substrate 10 includes a first portion 103a having a third roughness R3, a second portion 103b having a fourth roughness R4, and a third portion 103c having a fifth roughness R5. As will be seen, the fourth roughness R4 is caused by a second stage laser process. The third roughness R3 and the fifth roughness R5 are caused by a lateral tensile force. The third roughness R3, the fourth roughness R4, and the fifth roughness R5 are different. Additionally, the first roughness R1 is different from the third roughness R3, the forth roughness R4 and the fifth roughness R5.

According to experimental data, the fourth roughness R4 caused by the second laser process is larger than the first roughness R1 caused by the first laser process. More specifically, the fourth roughness R4 is at least 80 times larger than the first roughness R1. The third roughness R3 and the fifth roughness R5 caused by the lateral tensile force are larger than the first roughness R1. More specifically, the third roughness R3 and the fifth roughness R5 is at least 50 times larger than the first roughness R1.

Table 1 summarizes experimental data of the surface roughness, as discussed above. This experimental data were obtained using a white light interferometer, which is a non-contact way to measure the surface roughness ("roughness") known in the art. As shown, three (3) samples were taken for each roughness R1 to R5, and the mean values were then calculated. For instance, the mean roughness found for R1 (resulting from the first laser process) was a vertical deviation of 0.0026 μm which is relatively "smooth" compared to the 0.290 μm mean roughness for R4 (resulting from the second laser process) which is more than 100 times greater.

TABLE 1

| Surface Roughness | R1(μm) | R2(μm) | R3(μm) | R4(μm) | R5(μm) |
| --- | --- | --- | --- | --- | --- |
| Sample #1 | 0.0014 | 0.0171 | 0.209 | 0.367 | 0.460 |
| Sample #2 | 0.0027 | 0.0182 | 0.399 | 0.245 | 0.972 |
| Sample #3 | 0.0037 | 0.0154 | 0.312 | 0.259 | 0.410 |
| Mean of Samples #1, #2 and #3 | 0.0026 | 0.0169 | 0.307 | 0.290 | 0.614 |

Figure 3:
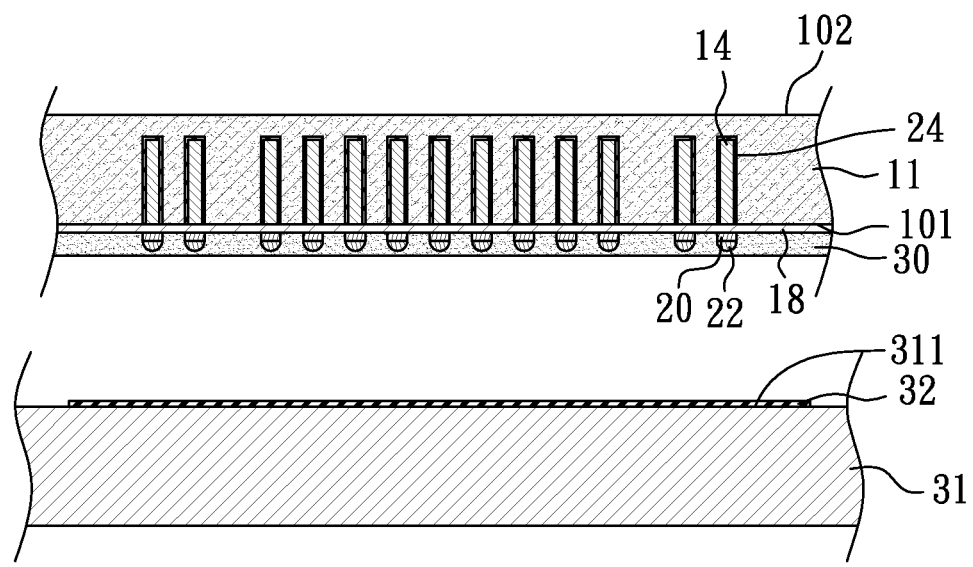
FIGS. 3 to 21 illustrate a semiconductor process for making a semiconductor device according to an embodiment of the present invention.

Referring to FIGS. 3 to 21, a semiconductor process for making the semiconductor device 1, according to an embodiment of the present invention, is illustrated. Referring to FIG. 3, a semiconductor wafer 11 is provided. The semiconductor wafer 11 has the first surface 101, the second surface 102, the at least one conductive via 14 and a plurality of cutting lines (not shown) which would indicate where the semiconductor wafer 11 is to be singulated into individual die. A first adhesive 30 is applied to the first surface 101 of the semiconductor wafer 11. In this embodiment, the first adhesive 30 is a solvent-dissolving adhesive, such as one of the X5000 and X5300 adhesive products manufactured by Sumitomo Chemical.

Additionally, a first carrier 31 is provided, which can be metal, a semiconductor material or an insulating material such as glass. The first carrier 31 has a first isolation coating 32 disposed on a surface 311 thereof. In this embodiment, the first isolation coating 32 is a hydrophobic coating.

Figure 4:
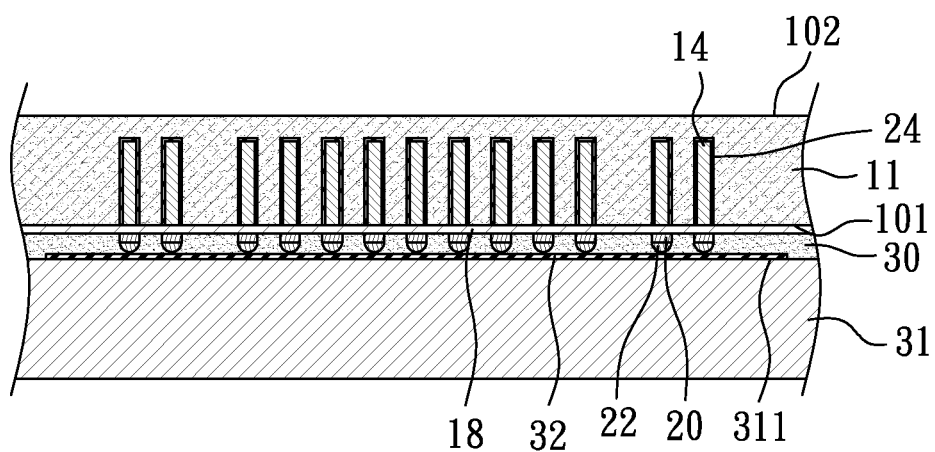

Referring to FIG. 4, the first carrier 31 is attached to the first surface 101 of the semiconductor wafer 11 by the adhesive 30. In this embodiment, the connection elements 22 are embedded in the first adhesive 30, and the thickness of the first adhesive 30 is larger than the height of the connection elements 22.

The first isolation coating 32 has a characteristic that the adhesion force between the first isolation coating 32 and the first adhesive 30 is relatively weak in comparison with the adhesion force between the first adhesive 30 and the semiconductor wafer 11. Furthermore, the area of the first isolation coating 32 is slightly smaller than that of the first adhesive 30 to ensure the semiconductor wafer 11 can be adhered to the first carrier 31 by the first adhesive 30

When the first carrier 31 and the first adhesive layer 30 are immersed in a solvent (not shown), part of the first adhesive layer 30 is dissolved and the first isolation coating 32 is exposed. After that, the first carrier 31 and the isolation coating 32 can be easily detached due to the weak adhesion force between the first adhesive layer 30 and the isolation coating 32.

Figure 5:
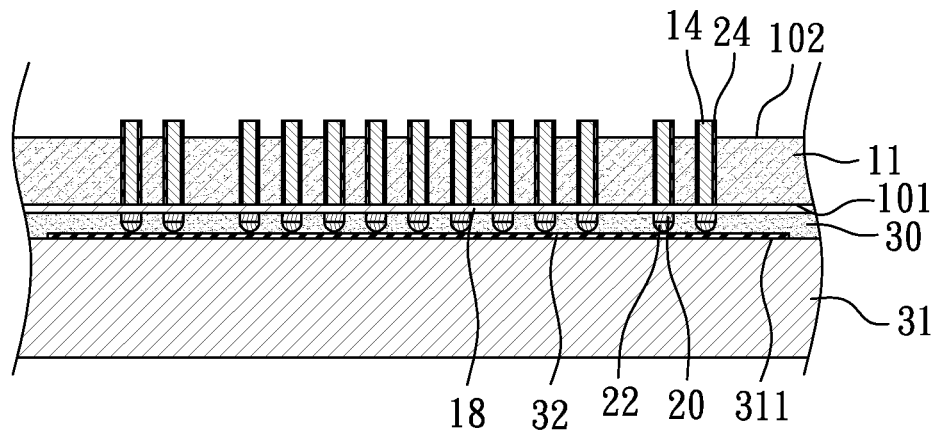

Referring to FIG. 5, a surface treatment is conducted on the second surface 102 of the semiconductor wafer 11. The second surface 102 of the semiconductor wafer 11 is thinned by grinding and/or etching, so that a portion of the semiconductor wafer 11 is removed from the second surface 102, and the conductive via 14 protrudes from the second surface 102 of the semiconductor wafer 11. Thus, the end or tip of the conductive via 14, which may include the liner 24, is exposed.

Figure 6:
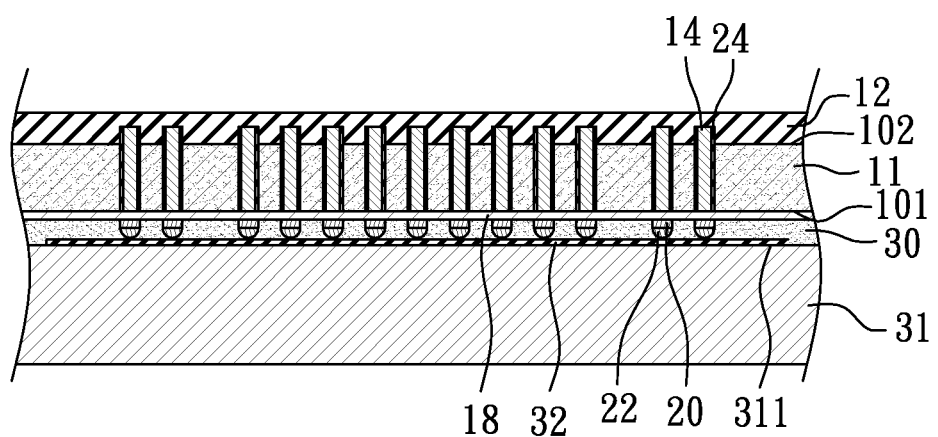

Referring to FIG. 6, a passivation layer 12 is formed on the second surface 102 by a laminating process or a spin coating process, for example, so as to cover the tips of the conductive vias 14. The passivation layer 12 may be a non-conductive polymer such as polyimide (PI), epoxy, polybenzoxazole (PBO) or benzocyclobutene (BCB); alternatively, an inorganic passivation layer, such as, silicon dioxide ($SiO_2$), may be used. In this embodiment, the passivation layer 12 can be a photo sensitive polymer such as benzocyclobutene (BCB), and can be formed by spin coating or spray coating.

Figure 7:
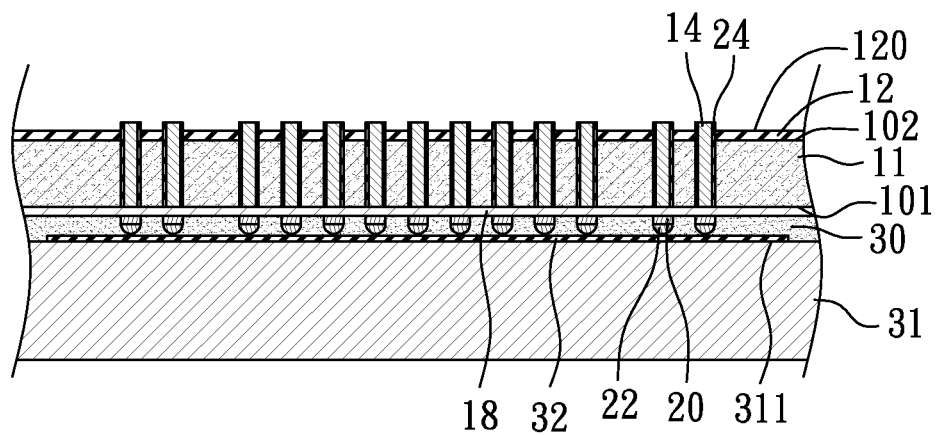

Referring to FIG. 7, the passivation layer 12 is thinned by grinding and/or etching, so that the tips of the conductive vias 14 protrude from the passivation layer 12. That is, portions of the passivation layer 12 remain on the second surface 102 of the semiconductor wafer 11 and fill or interlace the areas between the tips of the conductive vias 14.

Figure 8:
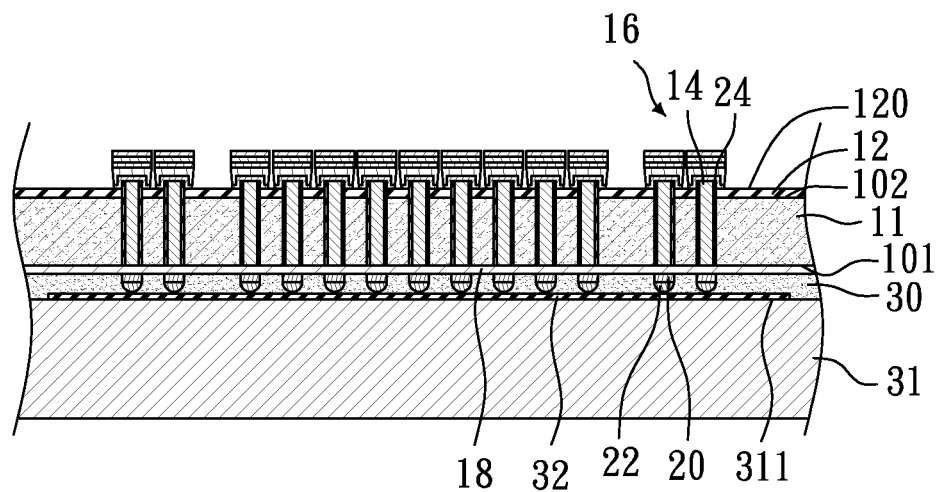

Referring to FIG. 8, the protection cap 16 is formed on the tip of the conductive via 14 and protruding portion of the liner 24.

Figure 9:
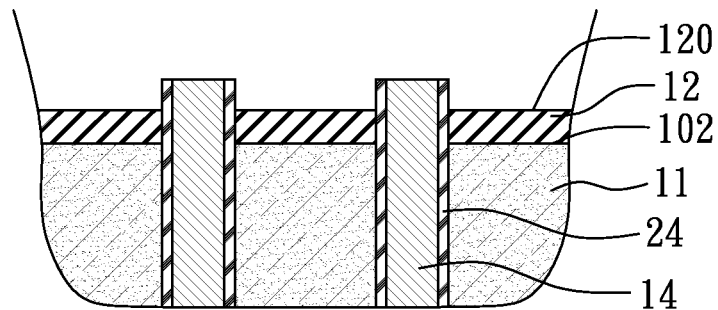

Referring to FIG. 9, a partially enlarged view of FIG. 7, illustrates the protruding conductive via 14 with the liner 24 and the remaining portions of the passivation layer 12 disposed in between the tips of the conductive vias 14 and recessed below a distal end of the vias 14.

Figure 10:
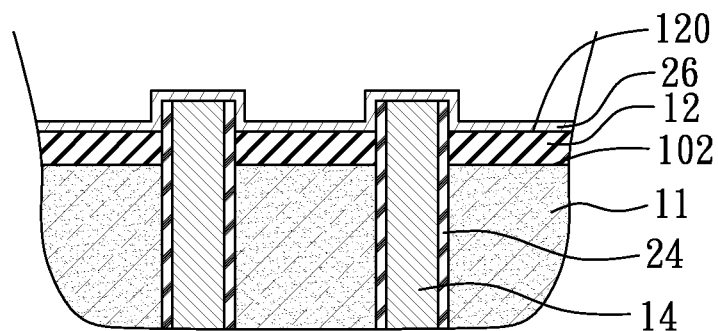

Referring to FIG. 10, a seed layer 26, such as a Ti/Cu layer or a Ti/W layer is disposed on the passivation layer 12, the conductive vias 14 and the liners 24 by sputtering or other methods known to those of ordinary skill. The seed layer 26 conforms to the topography of the upper surfaces of the various elements including the conductive vias 14 and the passivation layer 12.

Figure 11:
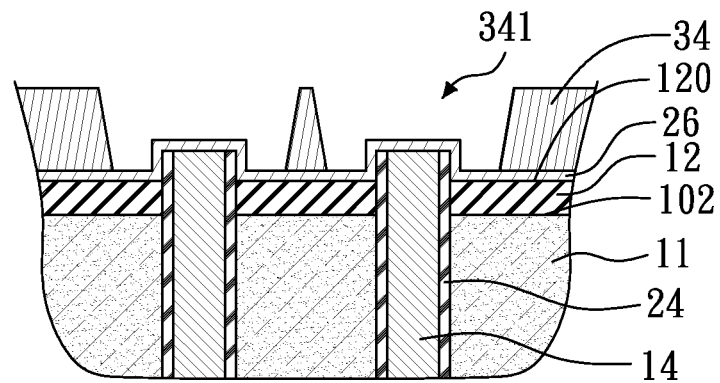

Referring to FIG. 11, a photo-resist layer 34 is formed on the seed layer 26, and a plurality of openings 341 are patterned in the photo-resist layer 34. The positions of the openings 341 correspond to the conductive vias 14, and have a tapered shape such that the top portion of each of the openings 341 is wider than the bottom portion of each of the openings 341.

Figure 12:
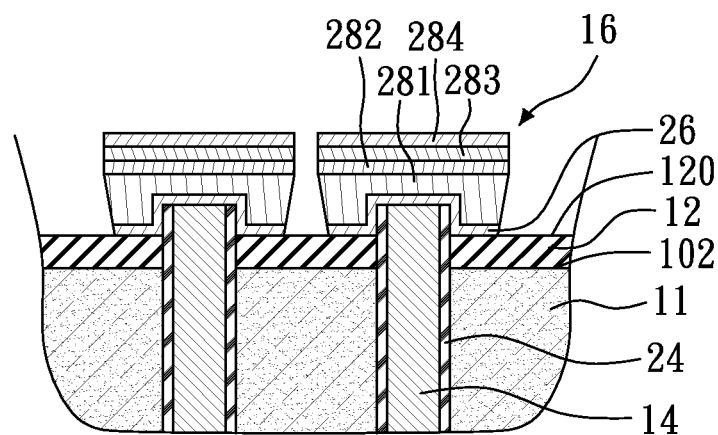

Referring to FIG. 12, a first conductive layer 281, a second conductive layer 282, a third conductive layer 283 and a fourth conductive layer 284 are formed in the openings 341, over the tips of the vias 14. In this embodiment, the first conductive layer 281 is Cu, the second conductive layer 282 is Ni, the third conductive layer 283 is Pd, and the fourth conductive layer 284 is Au. However, in other embodiments, the multi-layered structure disposed on the seed layer 26 may comprise a first conductive layer (Cu), a second conductive layer (Ni) and a third conductive layer (Sn/Ag or Au). Then, the photo-resist layer 34 is removed by photo-resist stripper, and part of the seed layer 26 that is disposed outside the first layer 281 is removed by etching process, so as to form the protection caps 16.

Figure 13:
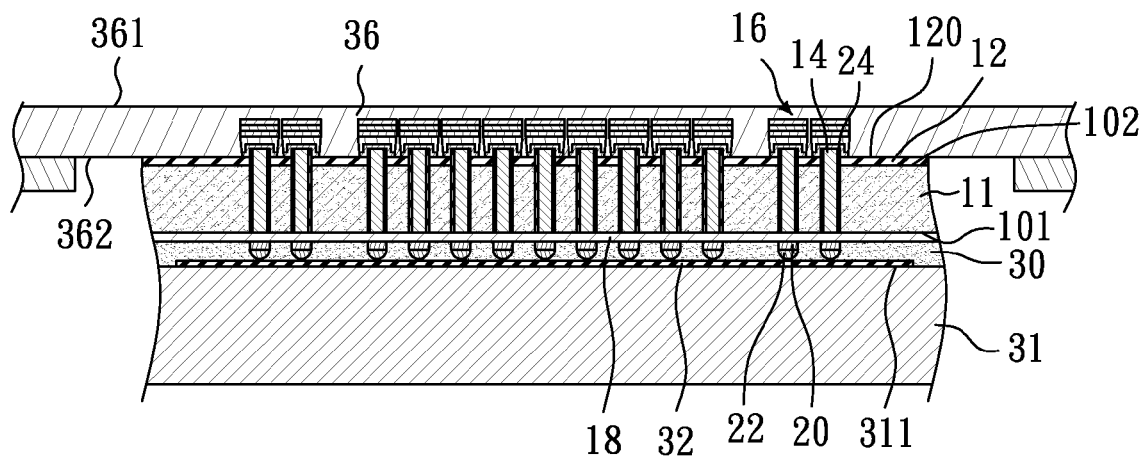

Referring to FIG. 13, a second carrier 36 is provided. In this embodiment, the second carrier 36 is a handling tape 36 which has a first surface 361, a second surface 362 and an adhesive layer (not shown) disposed on the second surface 362. The second surface 362 of the handling tape 36 is attached to the second surface 102 of the semiconductor wafer 11 through the adhesive layer (not shown) and the protection caps 16 are embedded into the adhesive (not shown).

Figure 14:
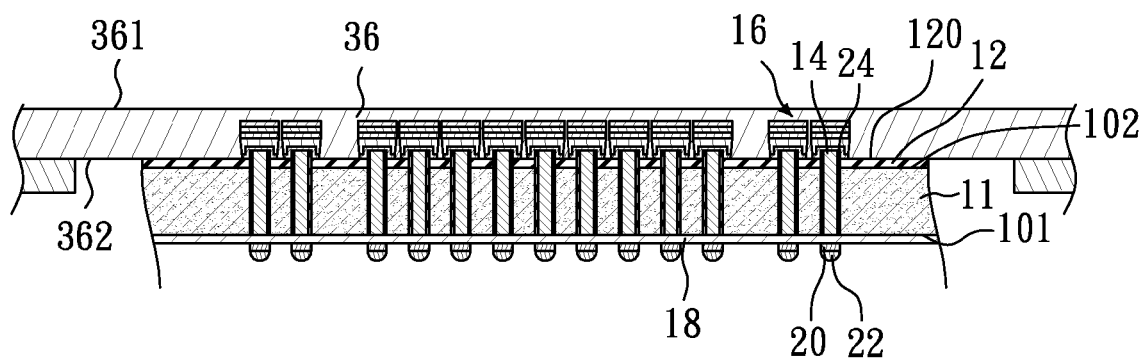

Referring to FIG. 14, the first carrier 31 and the first adhesive layer 30 are further immersed in a solvent (not shown), for example, gamma-Butyrolactone (GBL) or Propylene Glycol Monomethyl Ether Acetate (PGMEA), part of the first adhesive layer 30 is dissolved and the first isolation coating 32 is exposed. After that, the first carrier 31 and the isolation coating 32 is easily detached due to the weak adhesion force between the first adhesive layer 30 and the isolation coating 32. Thus, the first carrier 31 is detached from the semiconductor wafer 11. However, in other embodiments, a cutting process of the semiconductor wafer 11 may be conducted to detach the first carrier 31.

Figure 15:
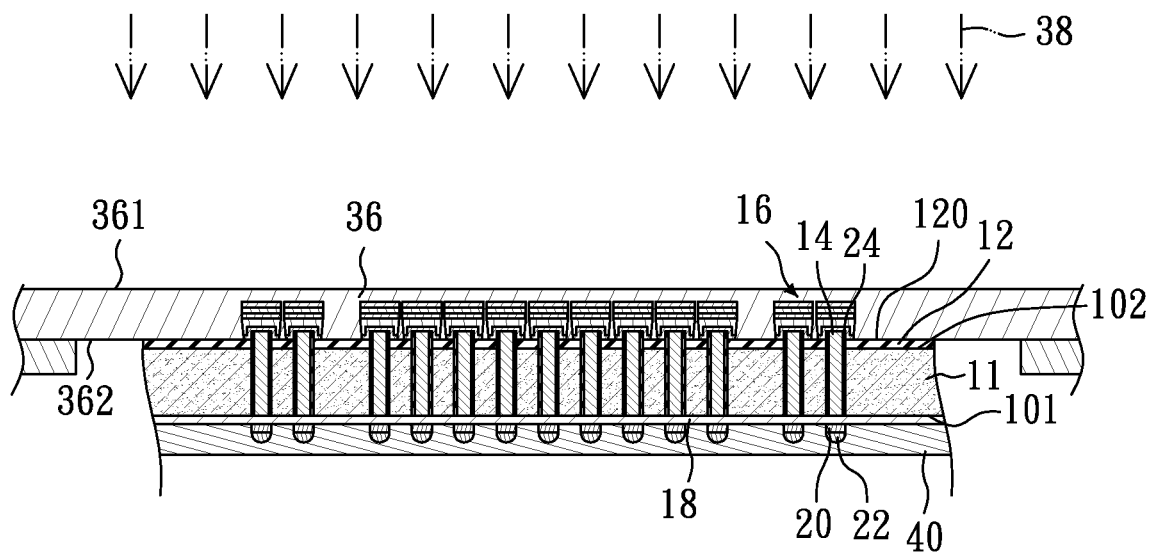

Referring to FIG. 15, an ultraviolet (UV) light (shown by arrows 38) is applied on the first surface 361 of the handling tape 36 so as to reduce the adhesion of the first dicing tape 36. Then, a dicing tape 40, such as a UV tape, is attached to the first or lower surface 101 of the semiconductor wafer 11.

Figure 16:
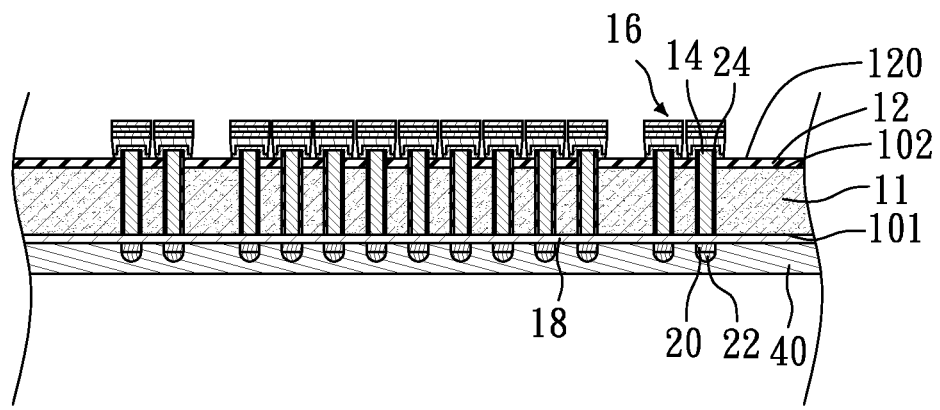

Referring to FIG. 16, the handling tape 36 is detached from the semiconductor wafer 11 and the upper surface of the wafer 11, including the protection caps 16, are exposed.

Figure 17:
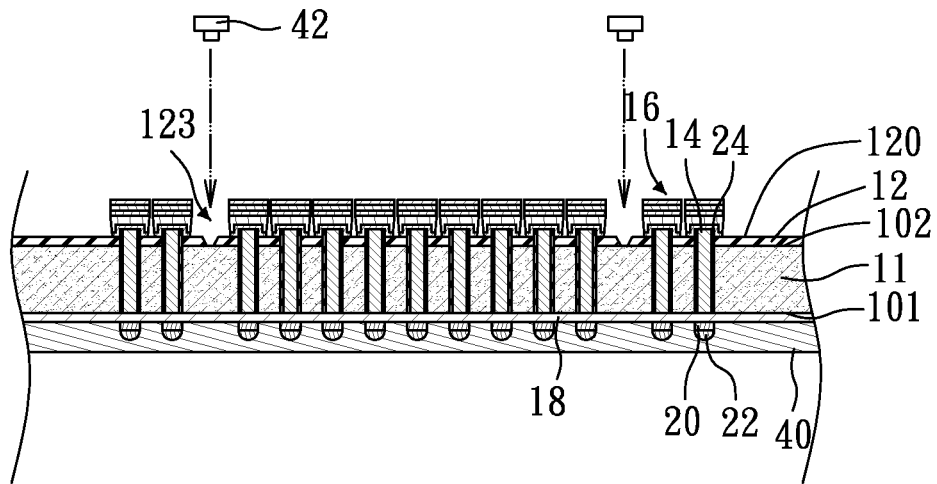

Referring to FIG. 17, a first laser 42, for example a laser sintering machine, such as model DFL7160 by DISCO Corporation, is applied and focuses on the passivation layer 12 to remove a part of the passivation layer 12 and form a plurality of trenches 123 in the vicinity of the wafer cut lines. Such process is a laser sintering process or a laser grooving process, and is further described as follows. The energy from the first laser 42 melts and then evaporates portions of the passivation layer 12 so as to form a plasma on the top surface thereof. As the plasma extends into the passivation layer 12, more and more materials are removed, and the trench 123 is formed. In this embodiment, the trenches 123 correspond to the cutting lines (not shown), and a width of each of the trenches 123 is less than a width of each of the cutting lines.

Figure 18:
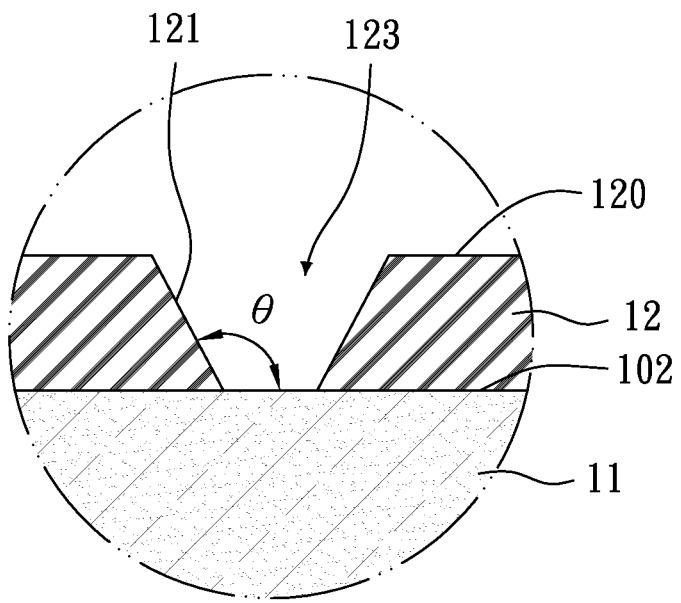
Figure 19:
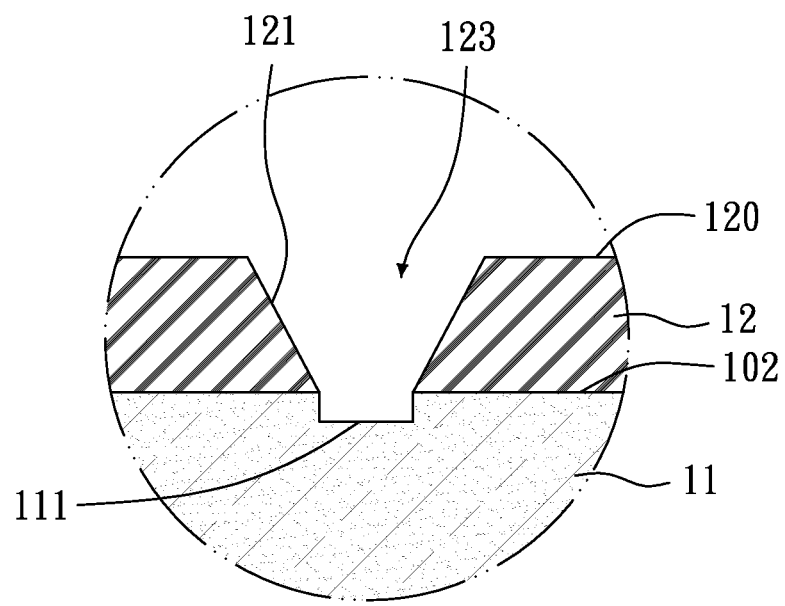

Referring to FIG. 18, a partially enlarged view of FIG. 17 is illustrated. As show, the trench 123 exposes a part of the second surface 102 of the semiconductor wafer 11. An inclination angle θ is formed between the side surface 121 of the passivation layer 12 and the second surface 102 of the semiconductor wafer 11. The first laser 42 is used to remove a part of the passivation layer 12 to ensure the flatness of the second surface 102 of the semiconductor wafer 11. In this embodiment, the first laser 42 is fixed in a specific wavelength, and no matter a shorter or longer pulse width, the trench 123 will show an inclination angle θ which is greater than 90 degrees and smaller than about 115 degrees. Referring to FIG. 19, another example of the trench 123 of the passivation layer 12 is illustrated. As shown in the figure, the semiconductor wafer 11 is further removed by the first laser 42 so as to form a notch 111 to ensure the passivation layer 12 on the surface of the cutting line is substantially entirely removed.

Figure 20:
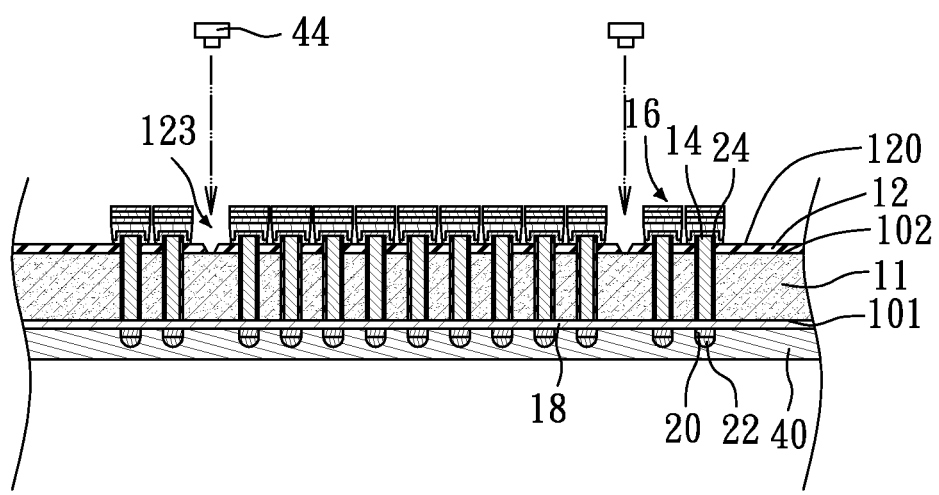

Referring to FIG. 20, a second laser 44, for example, a laser stealth dicing machine such as model DFL7360 by DISCO Corporation is applied along the trench 123. The second laser 44 is different from the first laser 42, and passes through the exposed second surface 102 of the semiconductor wafer 11. The second laser 44 focuses at an interior portion of the semiconductor wafer 11 so as to break the crystal structure of the material of the semiconductor wafer 11.

The second laser 44 at a wavelength capable of transmitting through the semiconductor wafer 11 is condensed by an objective lens and focused onto a point inside the semiconductor wafer 11. The second laser 44 uses short pulses oscillating at a high repetition rate and can be highly condensed to a diffraction threshold level. The second laser 44 is formed at an extremely high peak power density both time and spatially compressed in the vicinity of the light focus point. When the second laser 44 transmitting through the semiconductor wafer 11 exceeds a peak power density during the condensing process, a nonlinear absorption effect causes a phenomenon in which extremely high absorption occurs at localized points. By optimizing the second laser 44 and optical system characteristics to cause the nonlinear absorption effect just in the vicinity of the focal point inside the semiconductor wafer 11, only localized points in the semiconductor wafer 11 can be selectively laser-machined without damaging the front and back surface inside the semiconductor wafer 11. That is, the laser stealth dicing described herein makes use of wavelengths that transmit through the monocrystalline silicon semiconductor wafer to be diced, so that the laser beam can be guided to the vicinity of the focal laser machining within the semiconductor wafer 11. Therefore, a compressive stress is generated in a degeneration layer having a polycrystalline silicon state with high density dislocation in the cutting line.

Figure 21:
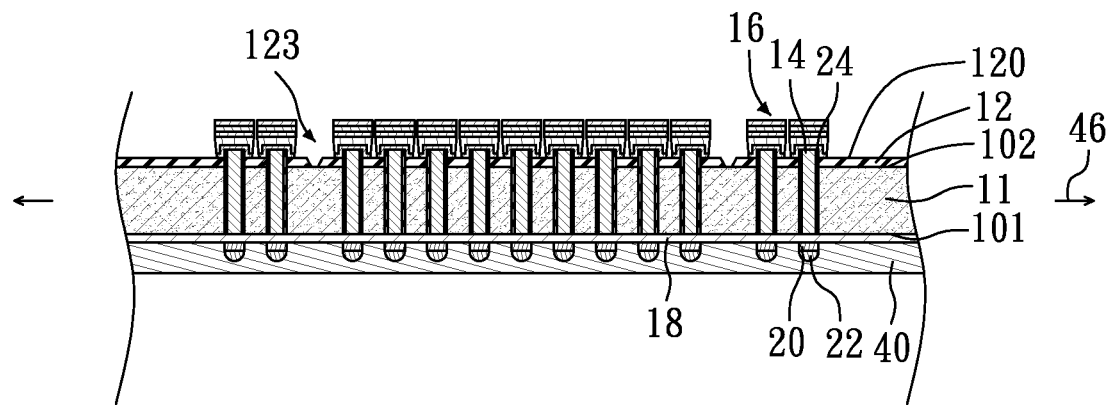

Referring to FIG. 21, a lateral tensile force (shown as arrow 46) is applied to the semiconductor wafer 11 for example by means of the dicing tape 40, so as to separate the wafer 11 into a plurality of semiconductor devices 1 as shown in FIG. 1. The semiconductor wafer 11 will be put on an enlarging apparatus (not shown). A lateral tensile force acts on the semiconductor wafer 11 attached to the enlarging apparatus. The semiconductor wafer 11 is singulated along the cutting lines, and is thus divided into the individual semiconductor devices 1.

To optimize the yield of the individual devices 1, the laser stealth dicing should be focused at the midpoint of the crystalline structure of the semiconductor wafer 11. Therefore, the planarity of the exposed second surface 102 of the semiconductor wafer 11 is significant. However, in this embodiment, the passivation layer 12 was disposed on the second surface 102 of the semiconductor wafer 11 with the at least one conductive via 14. The first laser 42 was used to remove a part of the passivation layer 12 to increase the planarity of the second surface 102 exposed from the semiconductor wafer 11. Further, the dicing process of this embodiment uses a laser rather than a cutting blade, so that it will not result in the collapse of the semiconductor wafer 11 and is suitable for narrow cutting lines.

Figure 22:
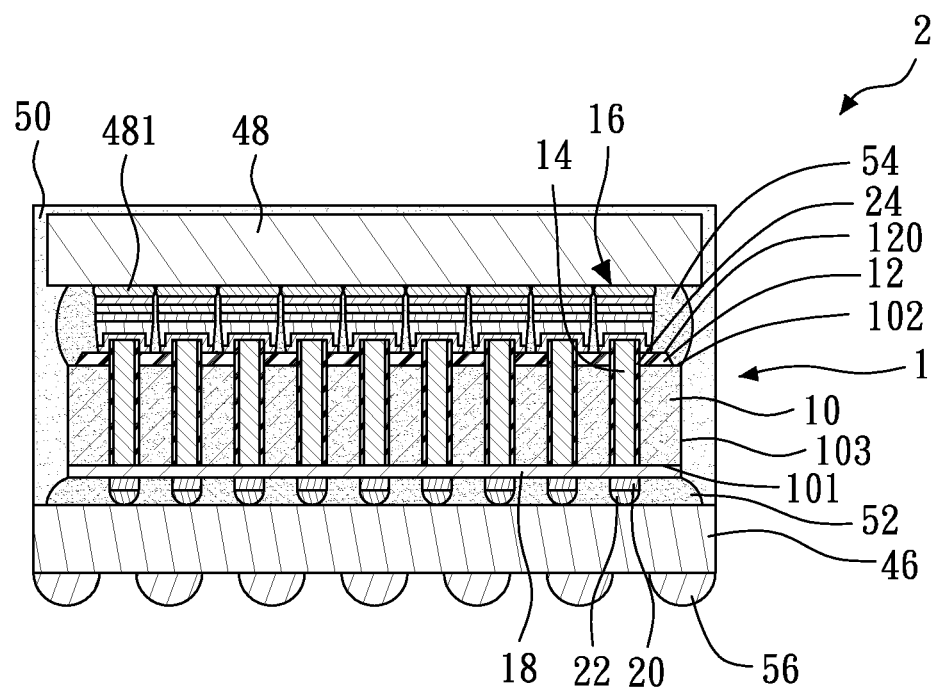
FIG. 22 illustrates a cross-sectional view of a semiconductor package according to another embodiment of the present invention.

Referring to FIG. 22, a cross-sectional view of a semiconductor package 2, according to another embodiment of the present invention, is illustrated. The semiconductor package 2 comprises a bottom substrate 46, the semiconductor device 1, a top semiconductor device 48 and a molding compound 50. The bottom substrate 46 is, for example, an organic substrate. The semiconductor device 1 is the same as the semiconductor device 1 as shown in FIG. 1, and is disposed on the bottom substrate 46.

The top semiconductor device 48 is disposed on the semiconductor device 1 and has at least one top external connection element 481 on a surface thereof. The protection cap 16 contacts the top external connection element 481.

The molding compound 50 encapsulates the bottom substrate 46, the semiconductor device 1 and the top semiconductor device 48. In this embodiment, the semiconductor package 2 further comprises an underfill 52, a non-conductive paste 54 and a plurality of solder balls 56. The underfill 52 is disposed between the semiconductor device 1 and the bottom substrate 46 so as to protect the external connection elements 22. The non-conductive paste 54 is disposed between the top semiconductor device 48 and the semiconductor device 1. The solder balls 56 are disposed on the bottom surface of the bottom substrate 46.

Figure 23:
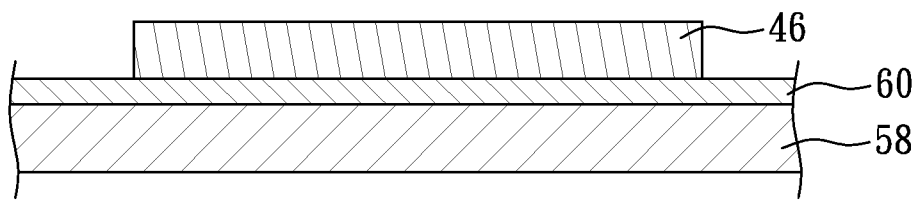
FIGS. 23 to 26 illustrate a semiconductor process for making a semiconductor package according to another embodiment of the present invention.

Referring to FIGS. 23 to 26, a semiconductor process for making a semiconductor package according to another embodiment of the present invention is illustrated. Referring to FIG. 23, a third carrier 58 and a bottom substrate 46 are provided. The bottom substrate 46 is attached to the third carrier 58 by an adhesive layer 60.

Figure 24:
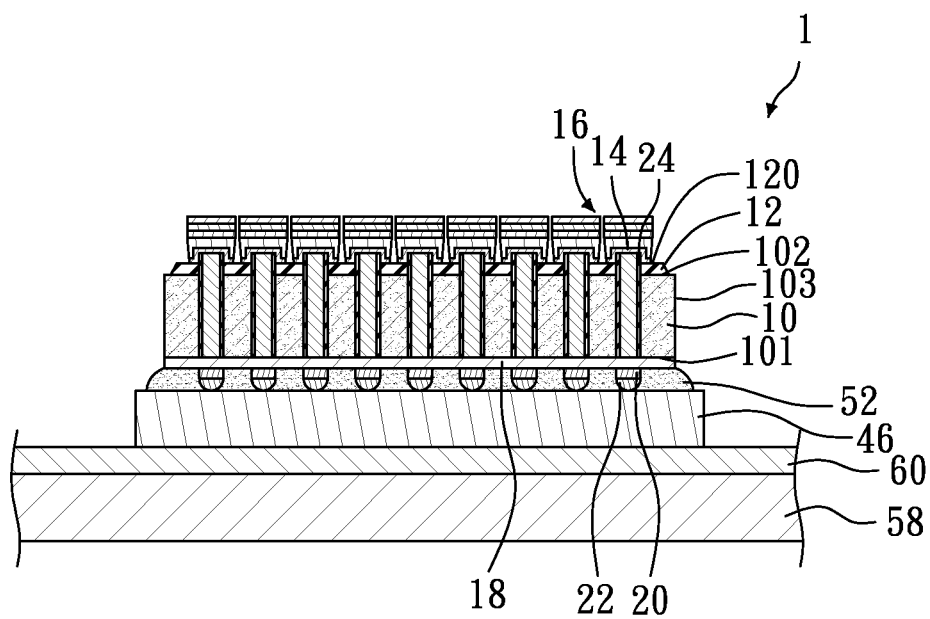

Referring to FIG. 24, the semiconductor device 1 is picked up and bonded to the bottom substrate 46 by a bonding head (not shown). An underfill 52 is formed between the semiconductor device 1 and the bottom substrate 46 so as to protect the external connection elements 22.

Figure 25:
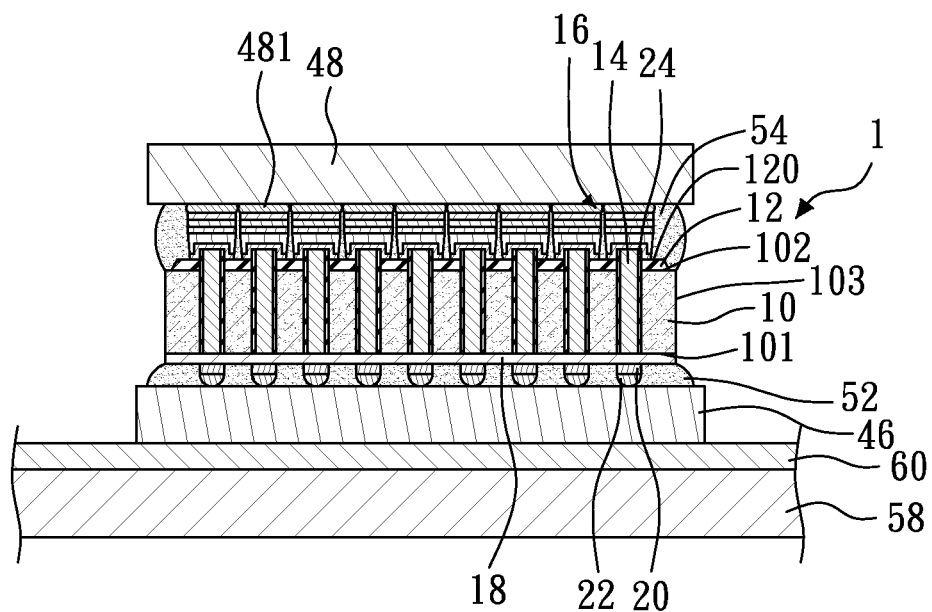

Referring to FIG. 25, a non-conductive paste 54 is formed over the passivation layer 12, and the top semiconductor device 48 is stacked on the semiconductor device 1. Meanwhile, the protection cap 16 contacts a top external connection element 481 (for example, solder ball) of the top semiconductor device 48.

Figure 26:
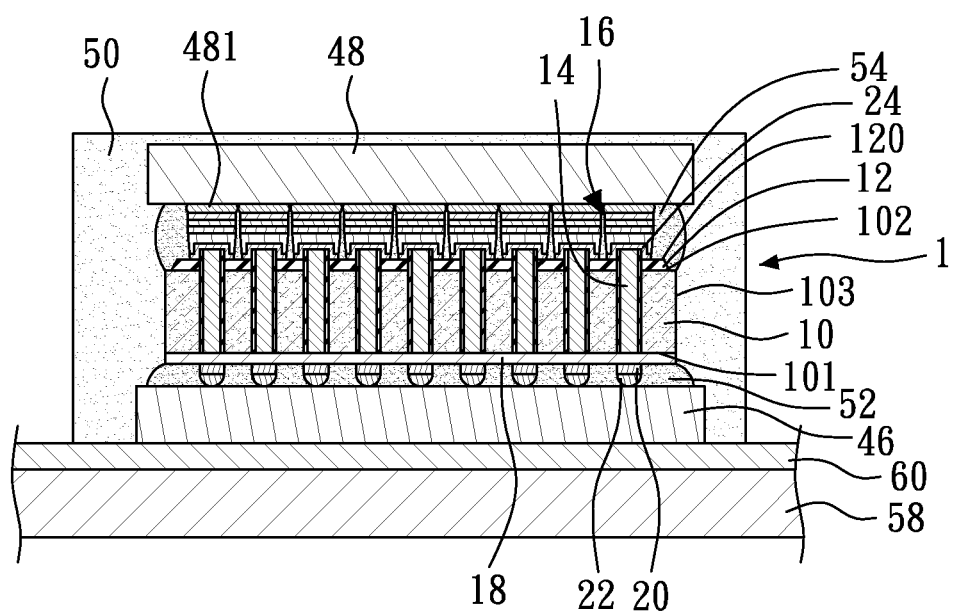

Referring to FIG. 26, a molding compound 50 is formed to encapsulate the bottom substrate 46, the semiconductor device 1 and the top semiconductor device 48. Then, the third carrier 58 and the adhesive layer 60 are removed, and a plurality of solder balls 56 are formed on the bottom surface of the bottom substrate 46. Thus, the semiconductor package 2 of FIG. 22 is obtained.

Referring to FIGS. 27 to 31, a semiconductor process for making the semiconductor device 1, according to another embodiment of the present invention, is illustrated. The UPH (unit per hour) of the simplified process described below could be higher than the previous process described above, and the yield could be enhanced by omitting a re-mount step to the dicing tape 40. This embodiment is subsequent to the step of FIG. 8.

Figure 27:
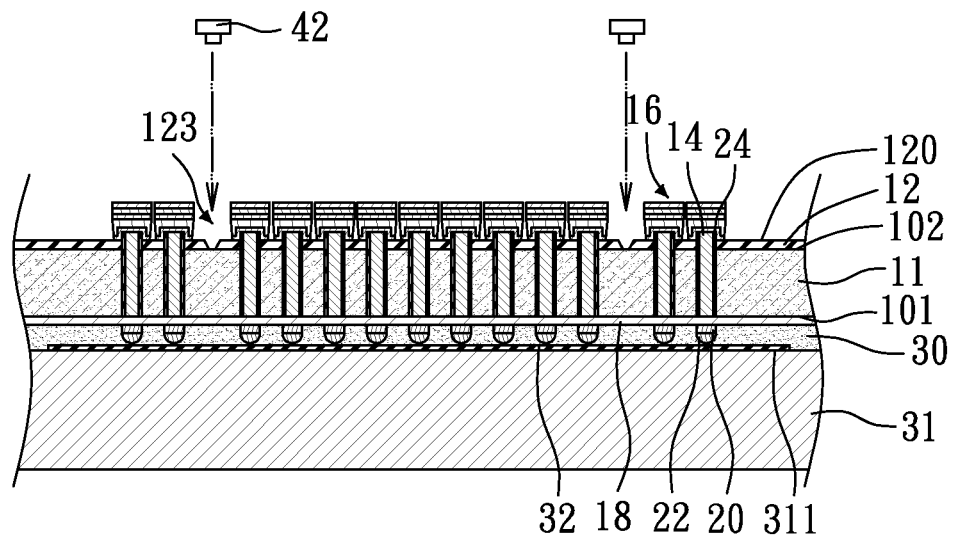
FIGS. 27 to 31 illustrate a semiconductor process for making a semiconductor device according to another embodiment of the present invention.

Referring to FIG. 27, a first laser 42 is applied and focuses on the passivation layer 12 to remove a part of the passivation layer 12 and form a plurality of trenches 123. In this embodiment, the trenches 123 correspond to the cutting lines (not shown), and a width of each of the trenches 123 is less than a width of each of the cutting lines.

Figure 28:
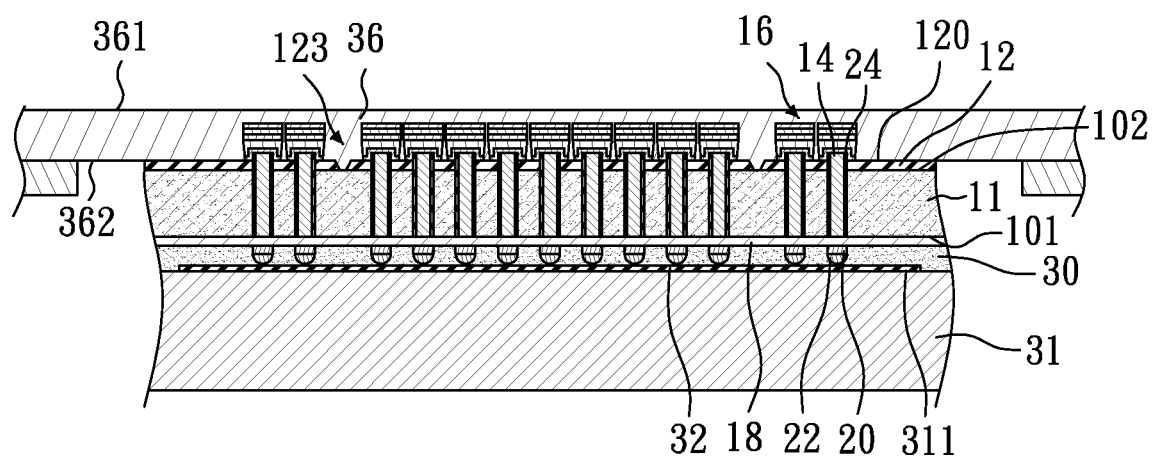

Referring to FIG. 28, a second carrier is provided. In this embodiment, the second carrier is a handling tape 36 which has a first surface 361, a second surface 362 and an adhesive layer (not shown) disposed on the second surface 362. The second surface 362 of the handling tape 36 is attached to the second surface 102 of the semiconductor wafer 11 through the adhesive layer (not shown) and the protection caps 16 are embedded into the adhesive (not shown).

Figure 29:
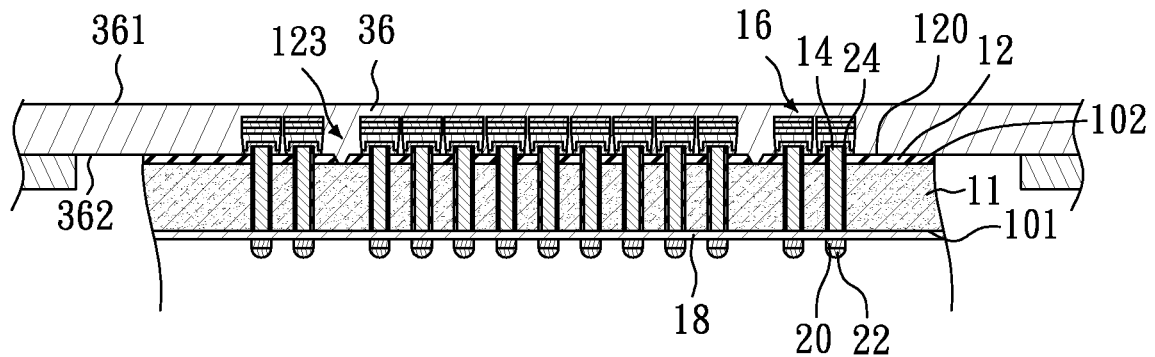

Referring to FIG. 29, the first carrier 31 and the first adhesive layer 30 are further immersed in a solvent (not shown), for example, gamma-Butyrolactone (GBL) or Propylene Glycol Monomethyl Ether Acetate (PGMEA), part of the first adhesive layer 30 is dissolved and the first isolation coating 32 is exposed. After that, the first carrier 31 and the isolation coating 32 is detached due to the weak adhesion force between the first adhesive layer 30 and the isolation coating 32. Therefore, the first carrier 31 is detached from the semiconductor wafer 11. However, in other embodiment, a cutting process of the semiconductor wafer 11 may be conducted to detach the first carrier 31.

Figure 30:
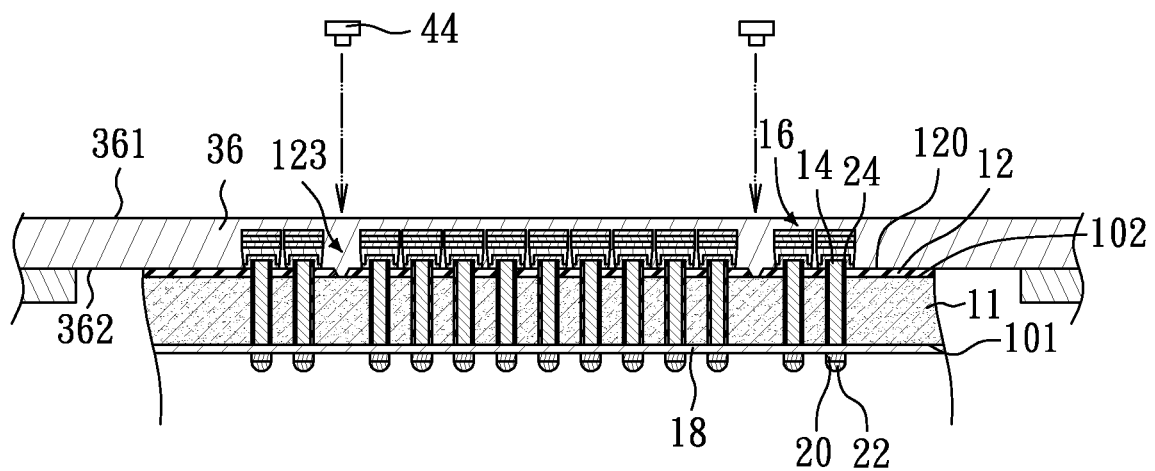

Referring to FIG. 30, a second laser 44 is applied along the trench 123. The second laser 44 is different from the first laser 42, and passes through the handling tape 36 and the exposed second surface 102 of the semiconductor wafer 11. The second laser 44 focuses at an interior of the semiconductor wafer 11 so as to break the crystal structure of the material of the semiconductor wafer 11. In this embodiment, the second surface 102 of the semiconductor wafer 11 in the trenches 123 is smooth after being processed by the first laser 42, thus, the cutting quality of the second laser 44 is ensured.

Figure 31:
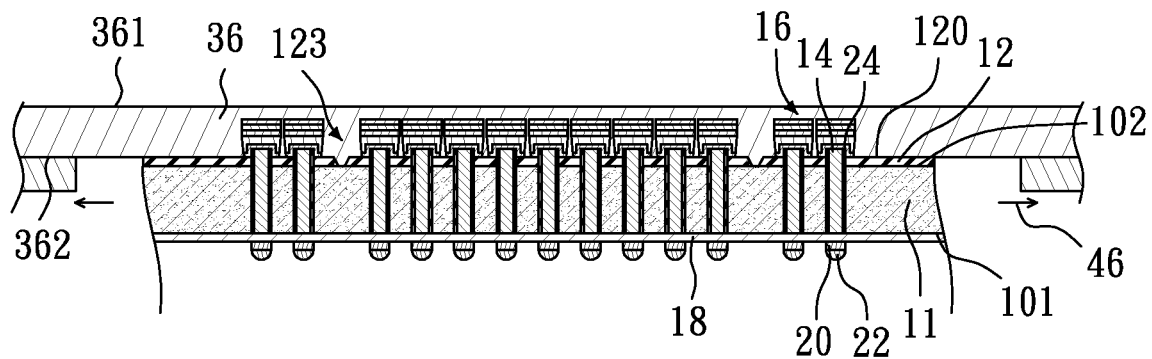

Referring to FIG. 31, a lateral force to 46 is applied to the semiconductor wafer 11 so as to form a plurality of semiconductor devices 1 as shown in FIG. 1.

Figure 32:
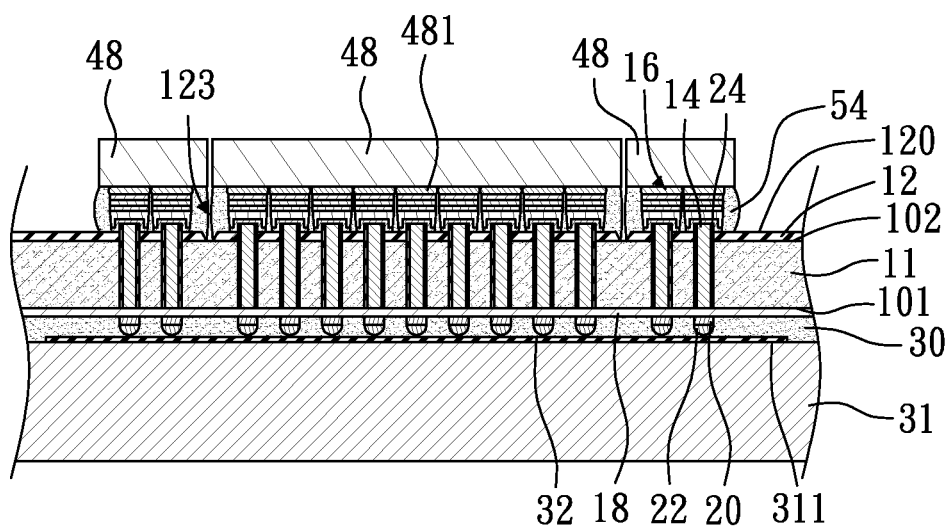
FIGS. 32 to 37 illustrate a semiconductor process for making a semiconductor package according to another embodiment of the present invention.

Referring to FIGS. 32 to 37, a semiconductor process for making the semiconductor package 2, according to another embodiment of the present invention, is illustrated. This embodiment is subsequent to the step of FIG. 27. Referring to FIG. 32, a non-conductive paste 54 is formed over the passivation layer 12, and a plurality of top semiconductor devices 48 are stacked on the semiconductor wafer 11. Meanwhile, the protection cap 16 contacts a top external connection element 481 (for example, solder ball) of the top semiconductor device 48.

Figure 33:
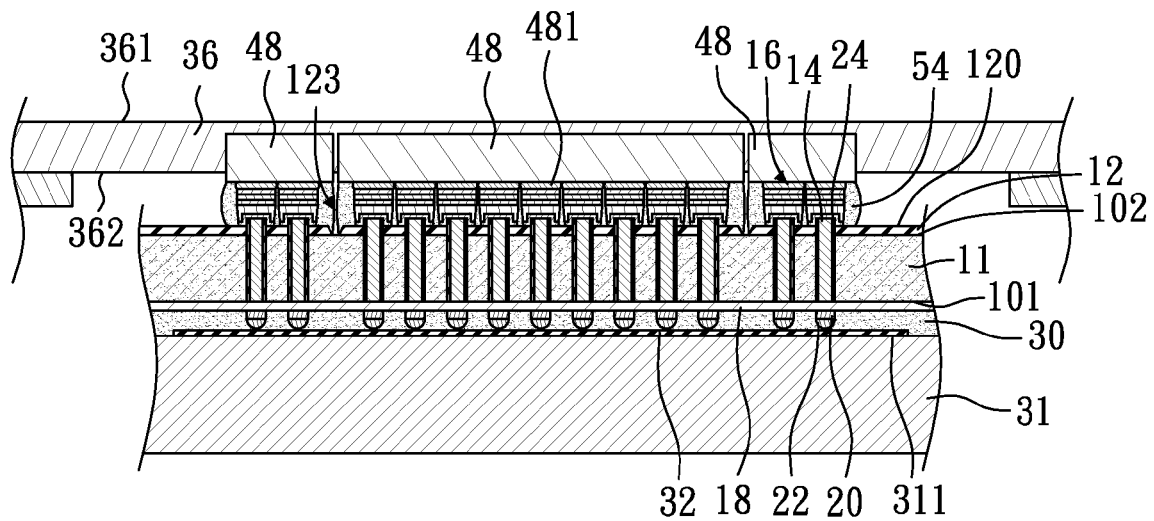

Referring to FIG. 33, a second carrier is provided. In this embodiment, the second carrier is a handling tape 36 which has a first surface 361, a second surface 362 and an adhesive layer (not shown) disposed on the second surface 362. The second surface 362 of the handling tape 36 is attached to the second surface 102 of the semiconductor wafer 11 through the adhesive layer (not shown) and the part of the top semiconductor devices 48 are embedded into the adhesive (not shown).

Figure 34:
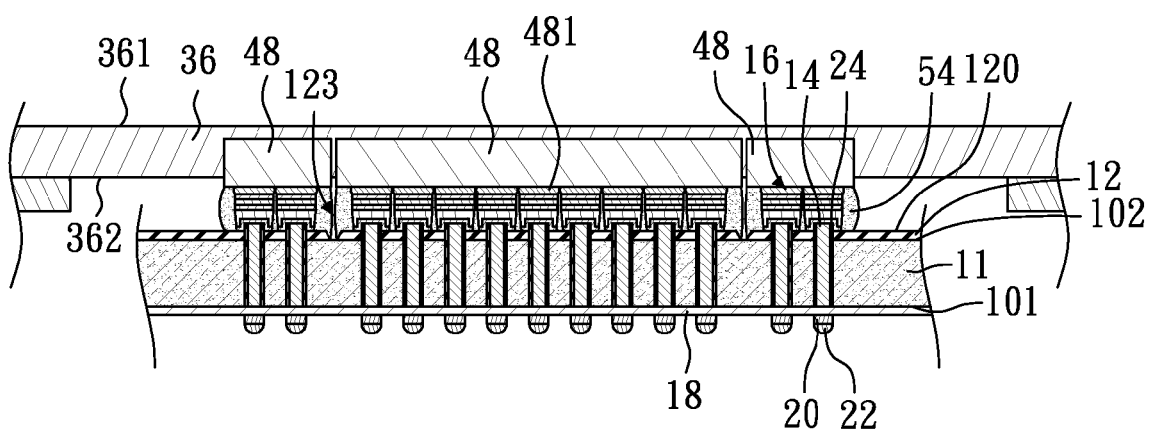

Referring to FIG. 34, the first carrier 31 and the first adhesive layer 30 are further immersed in a solvent (not shown), for example, gamma-Butyrolactone (GBL) or Propylene Glycol Monomethyl Ether Acetate (PGMEA), part of the first adhesive layer 30 is dissolved and the first isolation coating 32 is exposed. After that, the first carrier 31 and the isolation coating 32 is detached due to the weak adhesion force between the first adhesive layer 30 and the isolation coating 32. Therefore, the first carrier 31 is detached from the semiconductor wafer 11. However, in another embodiment, a cutting process of the semiconductor wafer 11 may be conducted to detach the first carrier 31.

Figure 35:
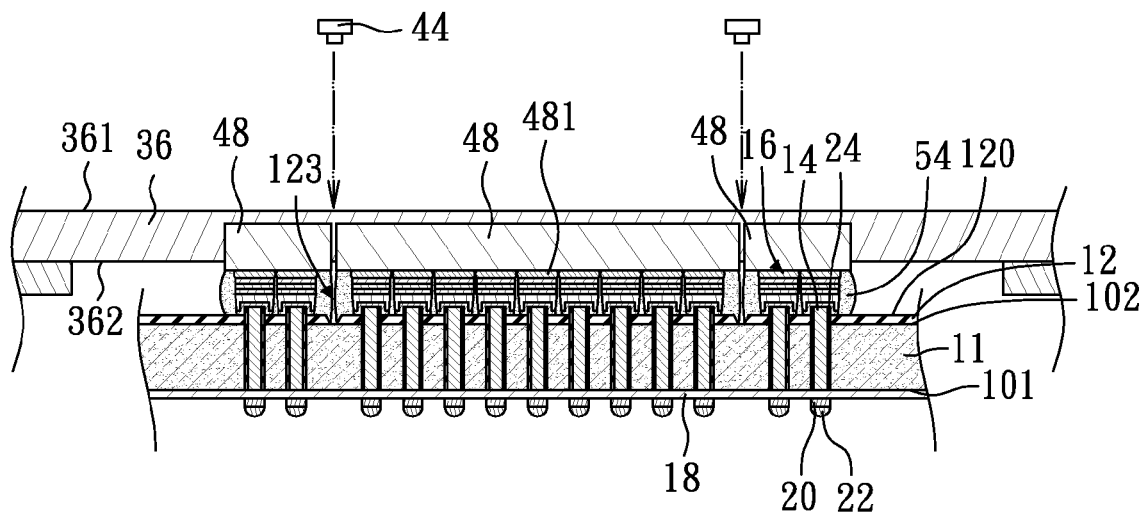

Referring to FIG. 35, a second laser 44 is applied along the trench 123. The second laser 44 is different from the first laser 42, and passes through the handling tape 36 and the exposed second surface 102 of the semiconductor wafer 11. The second laser 44 focuses at an interior of the semiconductor wafer 11 so as to break the crystal structure of the material of the semiconductor wafer 11.

However, in other embodiments, a dicing tape (not shown) may be attached to the first surface 101 of the semiconductor wafer 11. Then, the handling tape 36 is detached from the semiconductor wafer 11, so that the second laser 44 directly passes through the exposed second surface 102 of the semiconductor wafer 11 and focuses at an interior of the semiconductor wafer 11. In this embodiment, the exposed second surface 102 of the semiconductor wafer 11 is smooth after being processed by the first laser 42, ensuring good cutting quality with a high yield.

Figure 36:
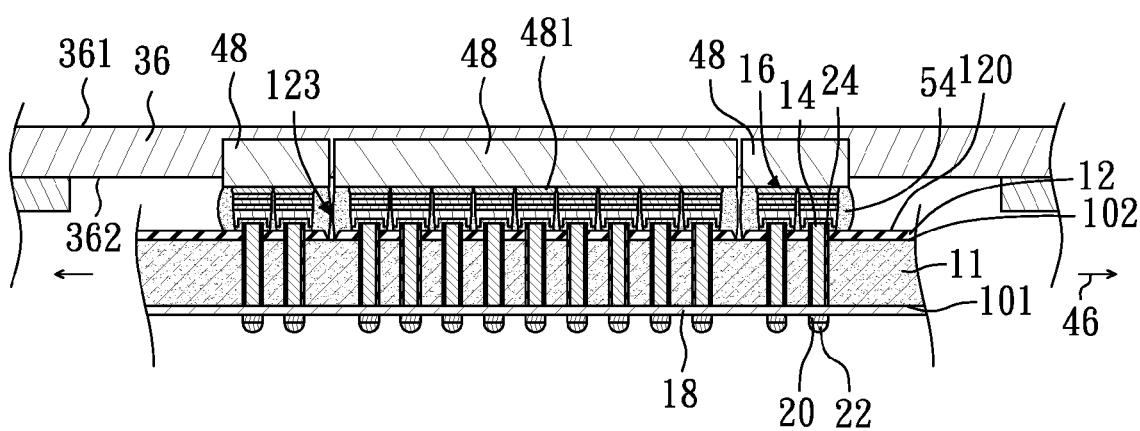
Figure 37:
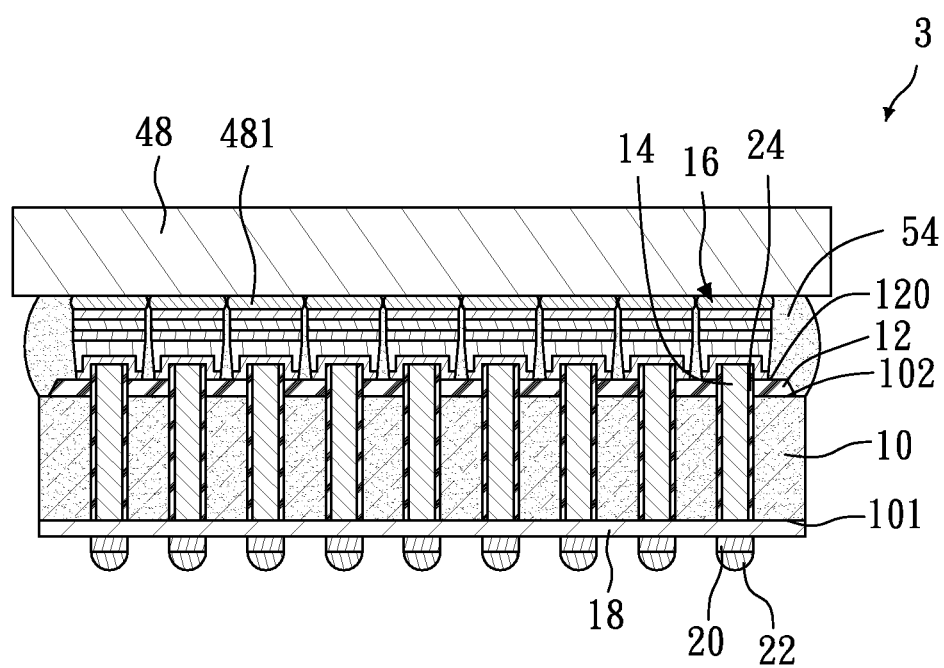

Referring to FIG. 36, a lateral force (shown as arrow 46) is applied to the semiconductor wafer 11 so as to form a plurality of combo devices 3 as shown in FIG. 37. Then, the combo device 3 is picked up and bonded to the bottom substrate 46 on the third carrier 58 by a bonding head (not shown). An underfill 52 is formed between the semiconductor device 1 and the bottom substrate 46 so as to protect the external connection elements 22. Then, a molding compound 50 is formed to encapsulate the bottom substrate 46 and the combo device 3. Then, the third carrier 58 is removed, and a plurality of solder balls 56 are formed on the bottom surface of the bottom substrate 46. Thus, the semiconductor package 2 of FIG. 22 is obtained.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device, comprising:
   a die;
   at least one conductive through via extending from a front surface of the die to a back surface of the die;
   a passivation layer disposed on a portion of the back surface of the die extending horizontally from a periphery of the conductive through via to a periphery of the back surface of the die, wherein the conductive through via protrudes from the passivation layer; and
   a protection cap disposed on all exposed surfaces of a protruded end of the conductive through via;

wherein the passivation layer has a lateral surface inclined at an angle greater than 90 degrees with respect to an exposed portion of the back surface of the die, the exposed portion not covered by the passivation layer.

2. The semiconductor device of claim 1, wherein the exposed portion of the back surface of the die is situated along a periphery of the back surface of the die.

3. The semiconductor device of claim 1, wherein the exposed portion of the back surface of the die has a first roughness and an upper surface of the passivation layer has a second roughness, the first roughness substantially less than the second roughness.

4. The semiconductor device of claim 3, wherein the first roughness is a result of laser sintering.

5. The semiconductor device of claim 1, wherein a lateral surface of the die has a first portion having a third roughness, a second portion having a fourth roughness, and a third portion having a fifth roughness; wherein the third roughness, the fourth roughness, and the fifth roughness are substantially different.

6. The semiconductor device of claim 5, wherein the fourth roughness is a result of laser stealth dicing.

7. The semiconductor device of claim 5, wherein the fourth roughness is at least 50 times greater than the first roughness.

8. The semiconductor device of claim 7, wherein the fourth roughness is at least 80 times greater than the first roughness.

9. The semiconductor device of claim 5, wherein the third roughness and the fifth roughness each is greater than the first roughness.

10. The semiconductor device of claim 9, wherein the third roughness and the fifth roughness each is at least 50 times greater than the first roughness.

11. The semiconductor device of claim 5, wherein the third roughness and the fifth roughness are results of a lateral tensile force.

12. The semiconductor device of claim 1, wherein the angle is greater than 90 degrees and smaller than 115 degrees.

13. The semiconductor device of claim 1, wherein the passivation layer further comprises a top surface and a lacuna portion, the lacuna portion surrounds the passivation layer, and a step is formed between the front surface and the back surface of the die.

14. The semiconductor device of claim 1, wherein the protection cap comprises a seed layer, a first conductive layer on the seed layer, a second conductive layer on the first conductive layer and a third conductive layer on the second conductive layer.

15. The semiconductor device of claim 14, wherein the first conductive layer is a Cu layer, the second conductive layer is a Ni layer and the third conductive layer is a Sn/Ag alloy or Au layer.

16. The semiconductor device of claim 14, wherein the protection cap further comprises a fourth conductive layer on the third conductive layer.

17. The semiconductor device of claim 16, wherein the first conductive layer is a Cu layer, the second conductive layer is a Ni layer, the third conductive layer is a Pd layer and the fourth conductive layer is an Au layer.

18. The semiconductor device of claim 1, wherein the conductive through via is surrounded by a non-conductive liner.

19. The semiconductor device of claim 1, further comprising an active surface disposed on the front of the die.

20. The semiconductor device of claim 19, further comprising at least one die bond pad and at least one connection element, the at least one die bond pad is disposed on the active surface and the at least one connection element is disposed on the at least one die bond pad.

* * * * *